(12) United States Patent
Liu et al.

(10) Patent No.: US 11,427,466 B2
(45) Date of Patent: Aug. 30, 2022

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Wei-Wei Liu, Kaohsiung (TW); Huei-Siang Wong, Kaohsiung (TW); Lu-Ming Lai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/517,444

(22) Filed: Jul. 19, 2019

(65) Prior Publication Data
US 2021/0017018 A1    Jan. 21, 2021

(51) Int. Cl.
*B81B 7/00*    (2006.01)
*B81C 1/00*    (2006.01)

(52) U.S. Cl.
CPC ........ *B81B 7/0051* (2013.01); *B81C 1/00325* (2013.01); *B81C 1/00801* (2013.01); *B81B 2203/0127* (2013.01); *B81B 2207/095* (2013.01); *B81B 2207/096* (2013.01); *B81B 2207/098* (2013.01); *B81C 2201/0132* (2013.01); *B81C 2201/053* (2013.01)

(58) Field of Classification Search
CPC ........... B81B 7/0051; B81B 2207/095; B81B 2203/0127; B81B 2207/098; B81B 2207/096; B81C 1/00325; B81C 1/00801; B81C 2201/0132; B81C 2201/053
See application file for complete search history.

(56) References Cited

U.S. PATENT DOCUMENTS

| | | | |
|---|---|---|---|
| 9,082,681 B2 | 7/2015 | Le Neel et al. | |
| 2009/0218684 A1* | 9/2009 | Pavier | H01L 23/3171 257/737 |
| 2009/0224344 A1* | 9/2009 | Huang | H01L 27/14618 257/432 |
| 2009/0267170 A1* | 10/2009 | Chien | H01L 27/14683 257/434 |
| 2010/0052153 A1* | 3/2010 | Koizumi | H01L 21/4853 257/697 |
| 2011/0024862 A1* | 2/2011 | Tu | H01L 27/14618 257/434 |
| 2012/0270354 A1* | 10/2012 | Hooper | G01L 19/141 438/51 |
| 2016/0068387 A1* | 3/2016 | Nakanishi | B81C 1/0023 257/415 |
| 2016/0075553 A1* | 3/2016 | Bilic | B81C 1/00825 257/419 |
| 2016/0237202 A1* | 8/2016 | Shiobara | C08G 59/30 |
| 2020/0161356 A1* | 5/2020 | Chen | H01L 21/56 |

* cited by examiner

*Primary Examiner* — Stephen M Bradley
*Assistant Examiner* — Wasiul Haider
(74) *Attorney, Agent, or Firm* — Foley & Lardner LLP

(57) ABSTRACT

A semiconductor package structure includes an electronic device having an exposed region adjacent to a first surface, a dam surrounding the exposed region of the semiconductor die and disposed on the first surface, the dam having a top surface away from the first surface, an encapsulant encapsulating the first surface of the electronic device, exposing the exposed region of the electronic device. A surface of the dam is retracted from a top surface of the encapsulant. A method for manufacturing the semiconductor package structure is also provided.

16 Claims, 17 Drawing Sheets

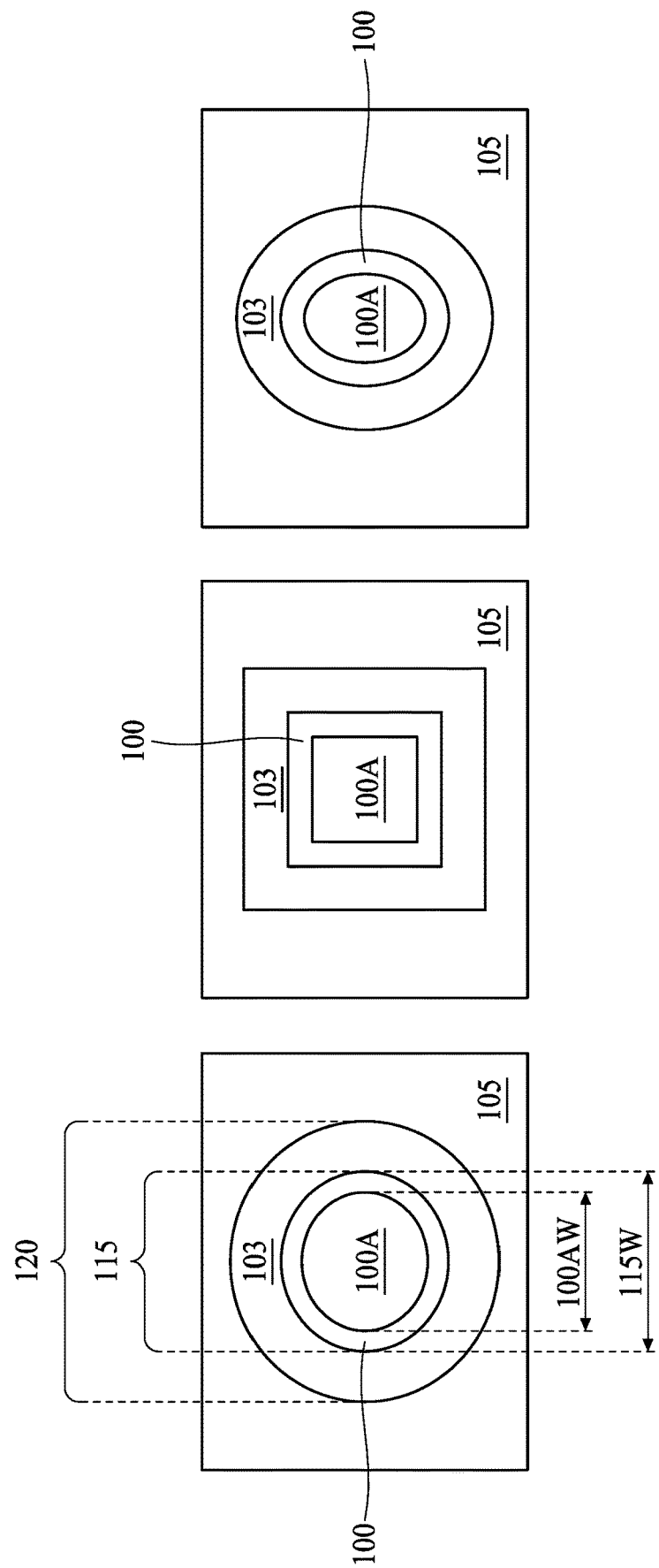

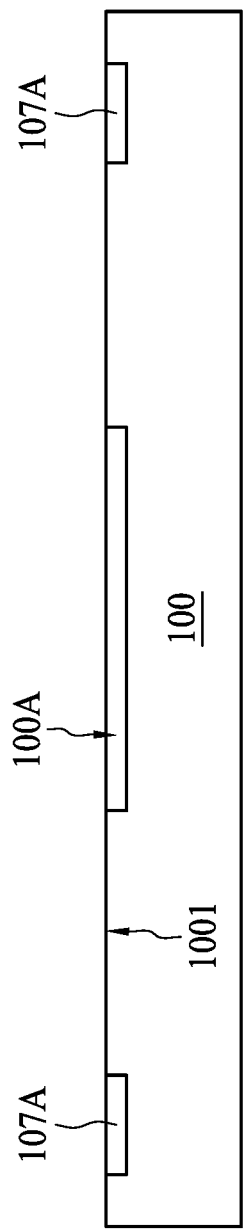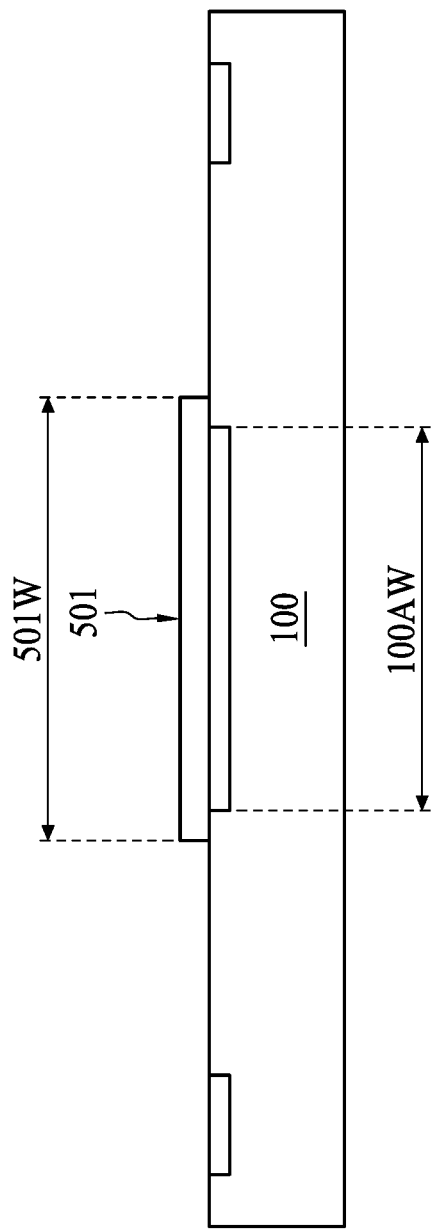

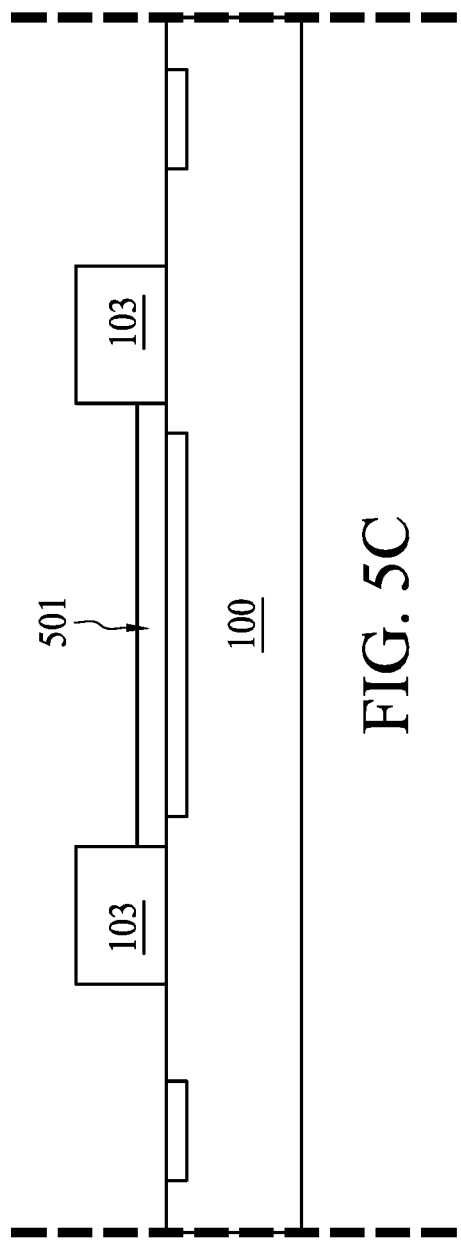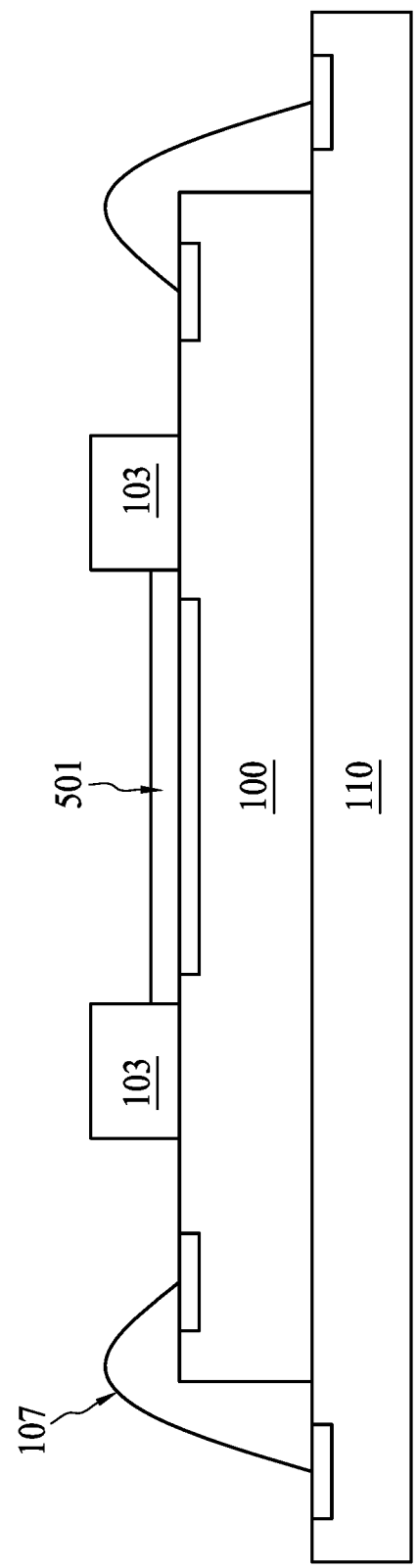

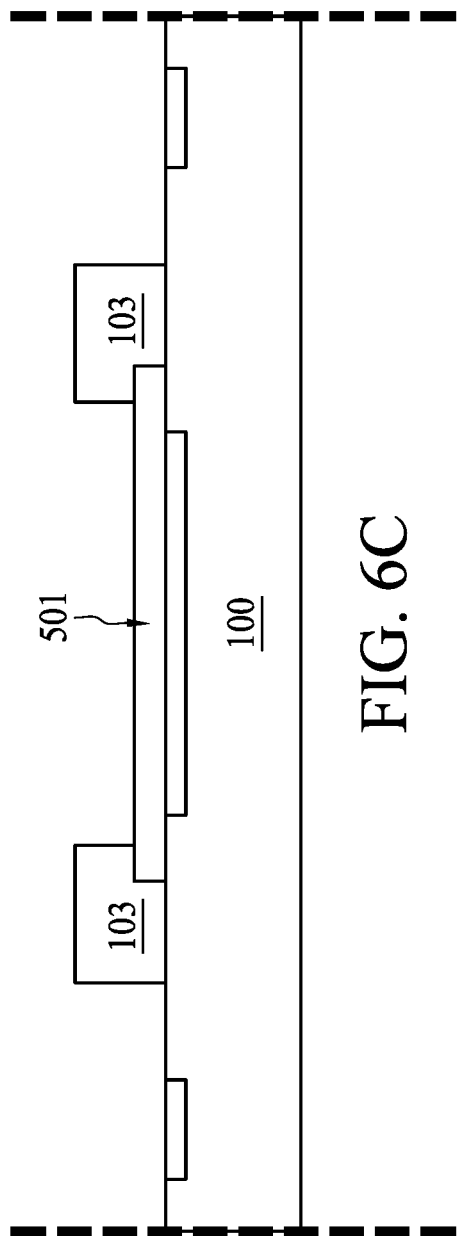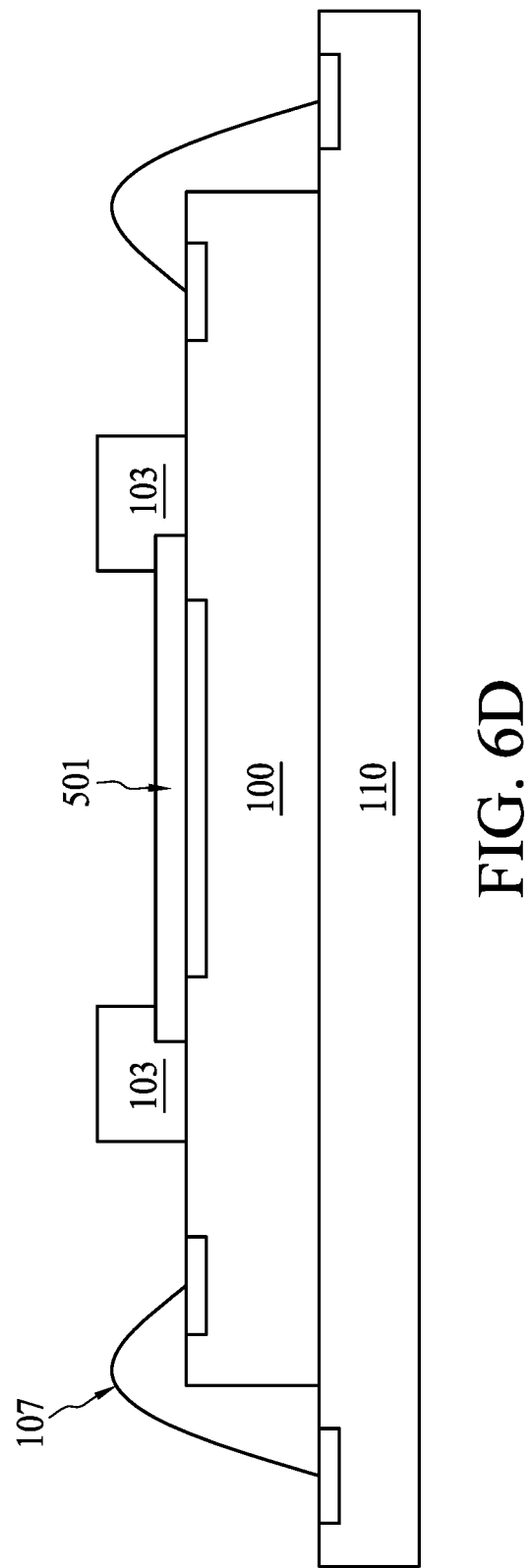

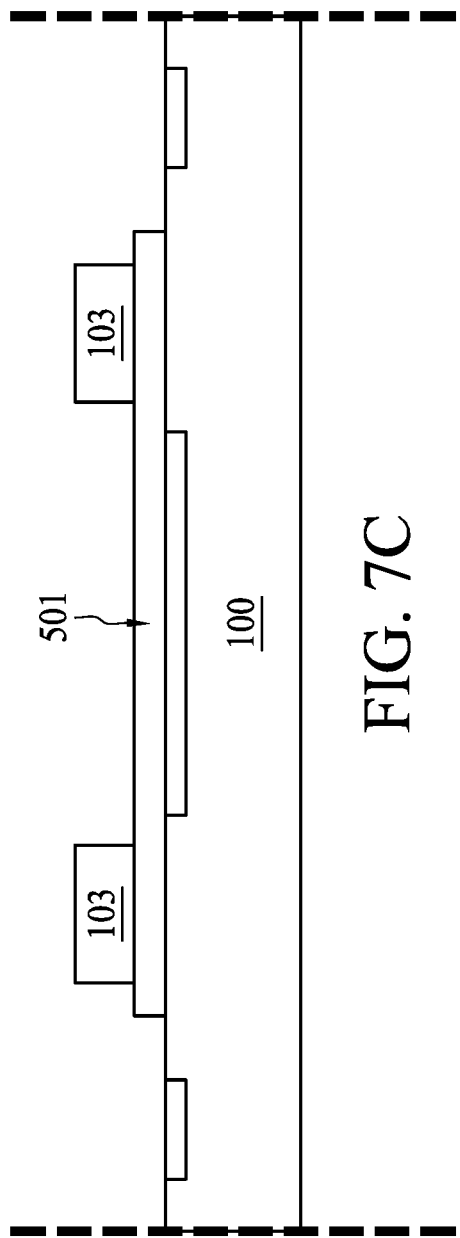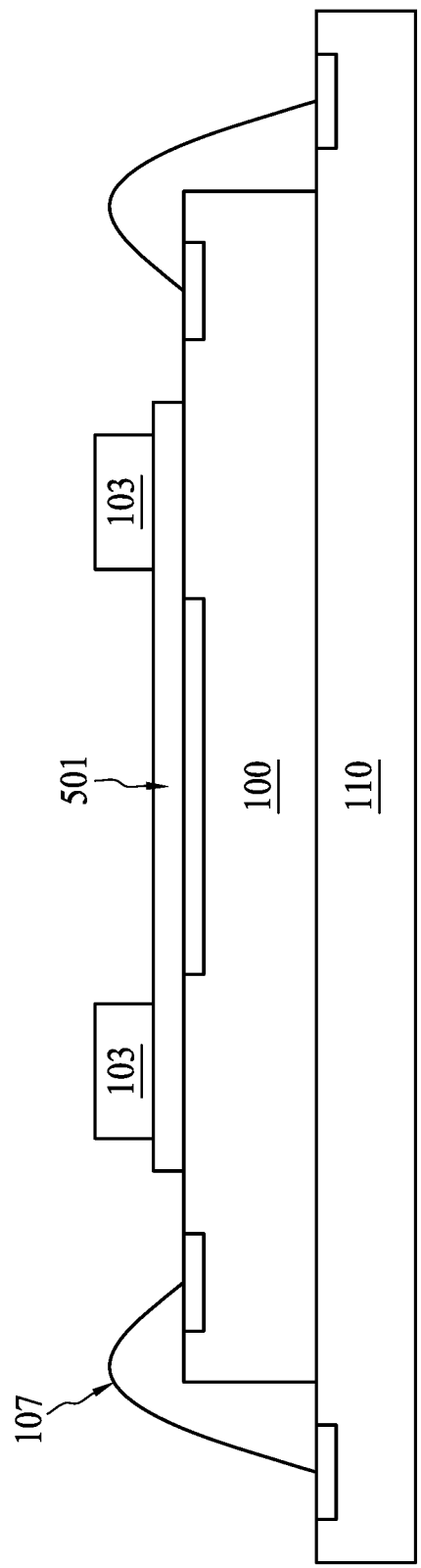

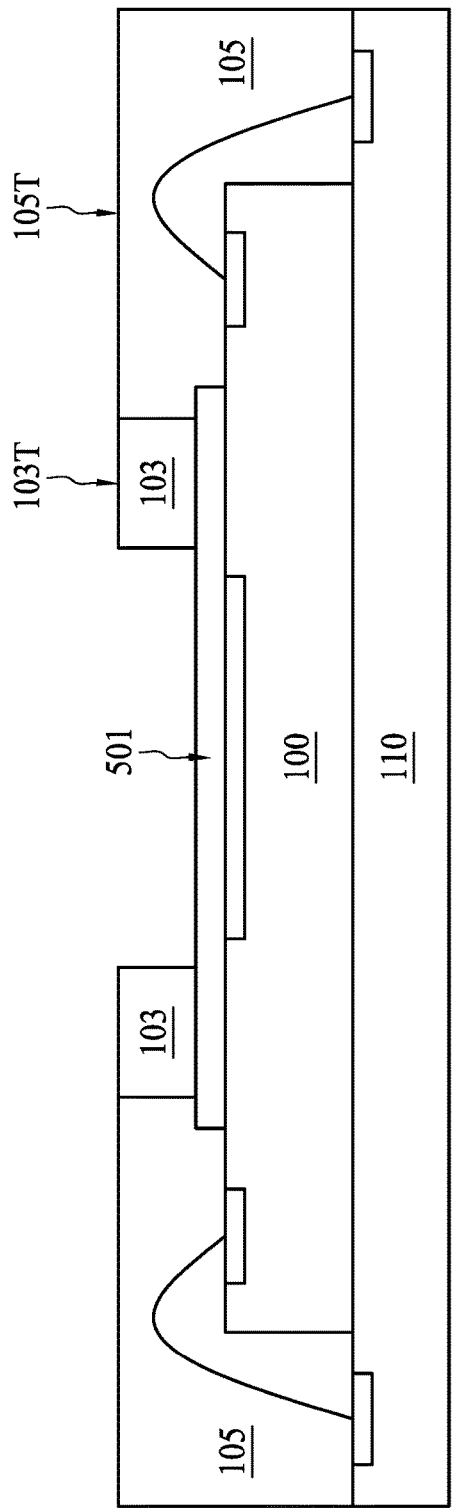
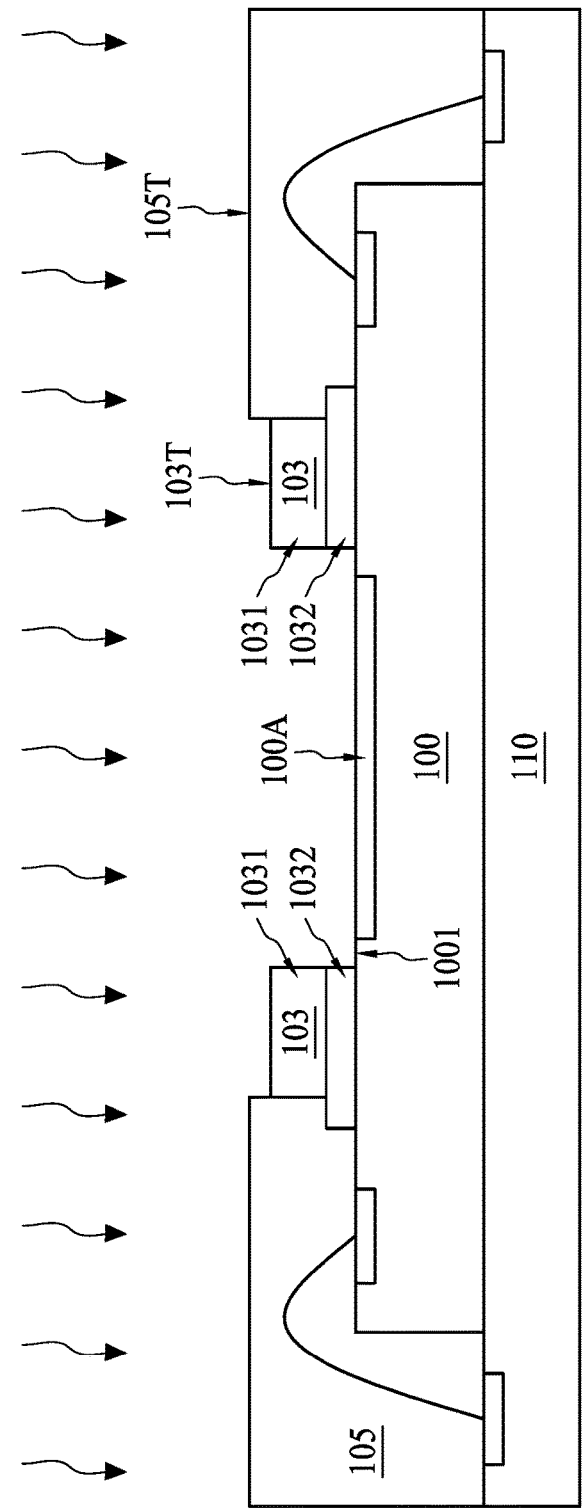
FIG. 7E
FIG. 7F

SEMICONDUCTOR PACKAGE STRUCTURE AND METHOD FOR MANUFACTURING THE SAME

BACKGROUND

1. Technical Field

The present disclosure relates to a semiconductor package structure having an open cavity.

2. Description of the Related Art

A semiconductor die or chip is an electrical component on which a microcircuit is built. The microcircuits can be interconnected together on the printed circuit board to form larger electrical circuits for use in radios, televisions, compact disk players, and computers, to name just a few. Because the semiconductor die is fragile, it is encased in a semiconductor die package to protect it from the environment. If one were to look inside an electronic device, such as a computer or a compact disk player, one would see one or more printed circuit boards on which semiconductor die packages are mounted and electrically interconnected.

In some applications, it may be desirable to expose the semiconductor die to the environment. Some semiconductor dies are designed for use as sensors for sensing, for example, an environmental condition. As a result, at least a portion of the semiconductor dies should be exposed to the environment in order to perform sensing functions. For example, the semiconductor die may serve as a sensor for sensing environmental condition.

SUMMARY

In some embodiments, the present disclosure provides a semiconductor package structure, including an electronic device having an exposed region adjacent to a first surface, a dam surrounding the exposed region of the semiconductor die and disposed on the first surface, the dam having a top surface away from the first surface, an encapsulant encapsulating the first surface of the electronic device, exposing the exposed region of the electronic device. A surface of the dam is retracted from a top surface of the encapsulant.

In some embodiments, the present disclosure provides a semiconductor package structure, including an electronic device having an exposed region adjacent to a first surface, and a dam surrounding the exposed region of the electronic device and disposed on the first surface, the dam having a first dielectric covering a second dielectric.

In some embodiments, the present disclosure provides a method for manufacturing a semiconductor package structure, the method includes patterning a passivation layer over a first surface of an electronic device, patterning a dam on the first surface adjacent to the passivation layer, and removing at least a portion of the passivation layer and exposes the first surface of the semiconductor die.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 4A illustrates a top view of a semiconductor package structure, according to some embodiments of the present disclosure.

FIG. 4B illustrates a top view of a semiconductor package structure, according to some embodiments of the present disclosure.

FIG. 4C illustrates a top view of a semiconductor package structure, according to some embodiments of the present disclosure.

FIG. 5A, FIG. 5B, FIG. 5C, FIG. 5D, FIG. 5E, and FIG. 5F illustrate cross sections of a semiconductor package structure during various manufacturing operations, according to some embodiments of the present disclosure.

FIG. 6A, FIG. 6B, FIG. 6C, FIG. 6D, FIG. 6E, and FIG. 6F illustrate cross sections of a semiconductor package structure during various manufacturing operations, according to some embodiments of the present disclosure.

FIG. 7A, FIG. 7B, FIG. 7C, FIG. 7D, FIG. 7E, and FIG. 7F illustrate cross sections of a semiconductor package structure during various manufacturing operations, according to some embodiments of the present disclosure.

DETAILED DESCRIPTION

Figure 1A:
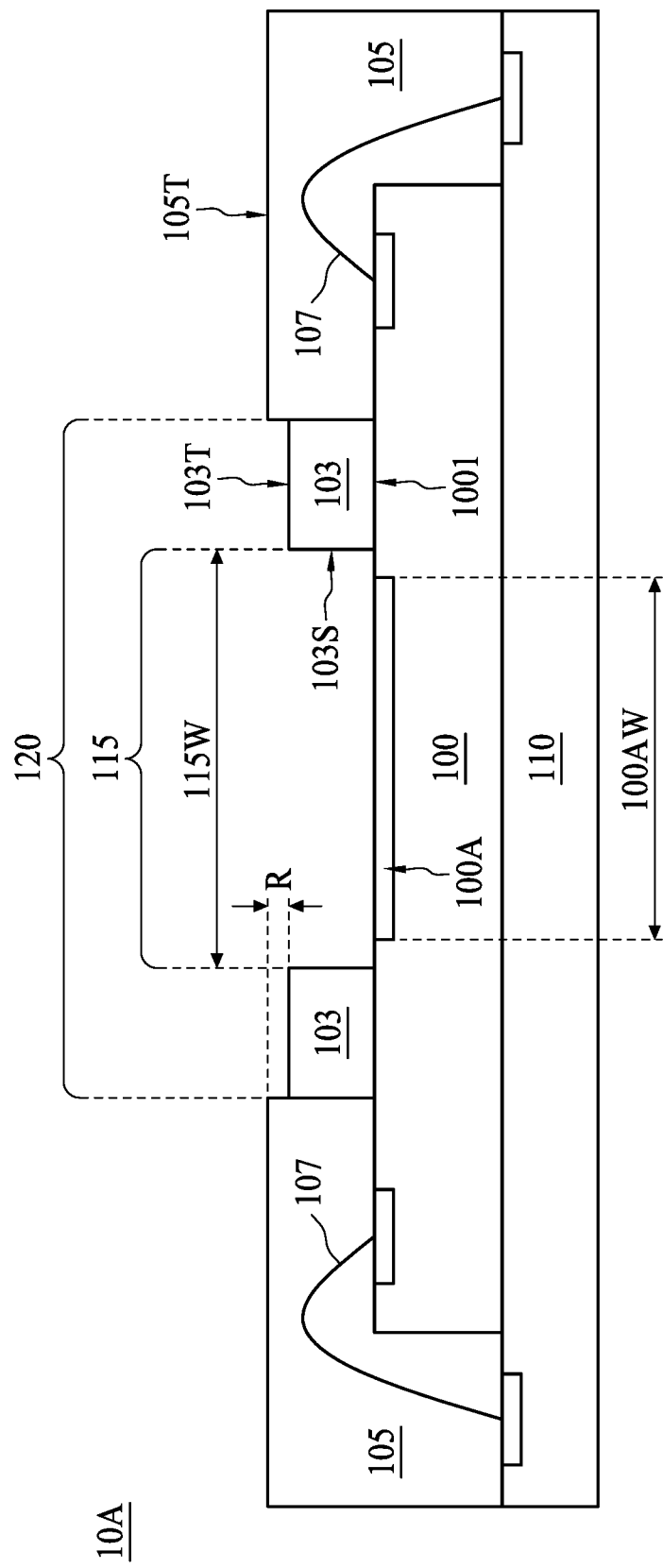
FIG. 1A illustrates a cross-sectional view of a semiconductor package structure, according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Active region of a Micro Electro Mechanical System (MEMS) package is sensitive to pressure during manufacturing operations. When an open cavity molding is to be applied so as to expose the active region from the molding compound, a portion of the molding tool is abutted to the active region in order to prevent the molding compound from entering the predetermined open cavity. Alternatively, dam structure may be applied to surround the active region prior to the molding operation so that the molding tool may not directly abut the active region and at the same time, prevent the molding compound from entering the predetermined open cavity. However, patterning the dam structure over the active region involves lithography operations, which may inevitably apply stress to the active region. Furthermore, active region becomes more and more sensitive and cannot be in contact with water or any wet chemical during subsequent packaging operation.

In another perspective, along with the miniaturization of the MEMS chip, area of the active region shrinks and corresponding shrinkage of the molding tool is desired to continue apply open cavity molding. However, shrinkage of the molding tool is not cost effective thus impeding the miniaturization trend.

Present disclosure provides an open cavity package structure having a dam structure surrounding the active region. Due to the fact that a passivation layer is patterned over the active region prior to forming the dam structure in order to protect the active region from water or wet chemical contamination, as well as the stress exerted by dam structure patterning operation, the passivation layer has to be removed after the molding operation thereby exposing the active region for serving the sensing purpose. The removal of the passivation layer (e.g., polymeric material) is associated with a directional etch (e.g., dry etch, reactive ion etch) which also consume a portion of the dam structure (e.g., polymeric material). A retracted top surface of the dam structure compared to the top surface of the molding as a result of such directional etch addresses the feature of current application.

Referring to FIG. 1A, FIG. 1A illustrates a cross-sectional view of a semiconductor package structure 10A, according to some embodiments of the present disclosure. The semiconductor package structure 10A includes an electronic device 100 on a carrier 110 such as a lead frame or a substrate. The electronic device 100 has a first surface 1001 facing away from the carrier 110. An encapsulant 105 encapsulates the electronic device 100 by, for example, in contact with the first surface 1001 and a side surface of the electronic device 100. The electronic device 100 has an exposed region 115 that is exposed from the encapsulation of the encapsulant 105. In some embodiments, the exposed region 115 may include an active region 100A of a MEMS die. The active region 100A may be a movable part or a sensing region. In some embodiments, the active region 100A includes a membrane structure adjacent to the first surface 1001. In some embodiments, the portion of the electronic device 100 exposed from the encapsulant 105 and a sidewall of the encapsulant 105 facing the exposed region 115 together from an open cavity 120. As illustrated in FIG. 1A, the encapsulant 105 has a top surface 105T facing away from the first surface 1001 or the carrier 110. Although appeared as a flat surface in FIG. 1A, the top surface 105T may not be substantially flat in other embodiments of the present disclosure. Top surface 105T with a rounded surface, an inclined surface, or an irregular surface are within the contemplated scope of the present disclosure.

A dam 103, for example, composed of epoxy-based materials or polymeric materials, surrounds the exposed region 115 adjacent to the first surface 1001 of the electronic device 100 and being disposed on the first surface 1001. In some embodiments, the encapsulant 105 and the dam 103 together define the exposed region 115 adjacent to the first surface 1001. The dam 103 includes a top surface 103T facing away from the first surface 1001 and a side surface 103S connecting the top surface 103T and the first surface 1001. In some embodiments, as shown in FIG. 1A, a side surface 103S of the dam 103 may be exposed to the open cavity 120. A side surface 103S of the dam 103 may be in contact with a sidewall of the encapsulant 105. Although appeared as a flat surface in FIG. 1A, the top surface 103T of the dam may not be substantially flat in other embodiments of the present disclosure. Top surface 103T with a rounded surface, an inclined surface, or an irregular surface are within the contemplated scope of the present disclosure.

In some embodiments, the top surface 103T of the dam 103 is retracted from the top surface 105T of the encapsulant 105. A step height R between the top surface 103T and the top surface 105T due to the retraction can be observed at least at the highest portion of each of the top surface 103T and the top surface 105T.

In some embodiments, the encapsulant 105 may be composed of epoxy resin having a functional filler. The functional filler of the present disclosure is any material, when added to the composition, imparts one or more intended electrical, thermally conductive or flame retardant properties. The amount of functional filler used in the epoxy resin composition will depend on the desired properties. In some embodiments, to obtain the desired electrical properties, high filler loading may be specified, e.g., loadings greater than 30, 40, 50, 60, or 70 weight percent. In some embodiments, the functional filler is a material that increases the dielectric constant of the epoxy composition.

In some embodiments, the dam may be composed of radiation or irradiation sensitive material which may perform photoinduced cross-linking as used in a negative photoresist. The intermediate layer comprises epoxidized bisphenol-A/formaldehyde novolac co-polymer (SU8). SU8, in the presence of an appropriate photo acid generator, favorably becomes a negative resist. It has a number of advantageous characteristics, including good film forming properties, good adhesion, simple processing, high optical transmission and, when cross-linked, excellent chemical and thermal stability. SU8 can also, favorably be deposited on a variety of substrate surfaces, and in general other thin films adhere well to it.

A conductive terminal 107 connecting the electronic device 100 and the underlying carrier 110 may be included in the semiconductor package structure 10A with a form of bonding wires, as illustrated in FIG. 1A. The conductive terminal 107 is further electrically coupled to the exposed region 115 of the electronic device 100. The conductive terminal 107 is further electrically coupled to the active region, the movable part, the membrane, or the sensing region of the electronic device 100. In some embodiments, the conductive terminal 107 includes a conductive pad on a portion of the first surface 1001 away from the exposed region 115, a conductive pad on the carrier 110, and a conductive wire connecting the respective conductive pads.

The exposed region 115 may include a width 115W, and the width 115W can be measured as a distance between inner sidewall surfaces of the dam 13 facing each other. The active region 100A in the exposed region 115 may include a width 100AW. Since the dam 103 is not projecting over the exposed region 115, or the active region 100A of the exposed region 115, in some embodiments, the width 115W is greater than the width 100AW.

Figure 1B:
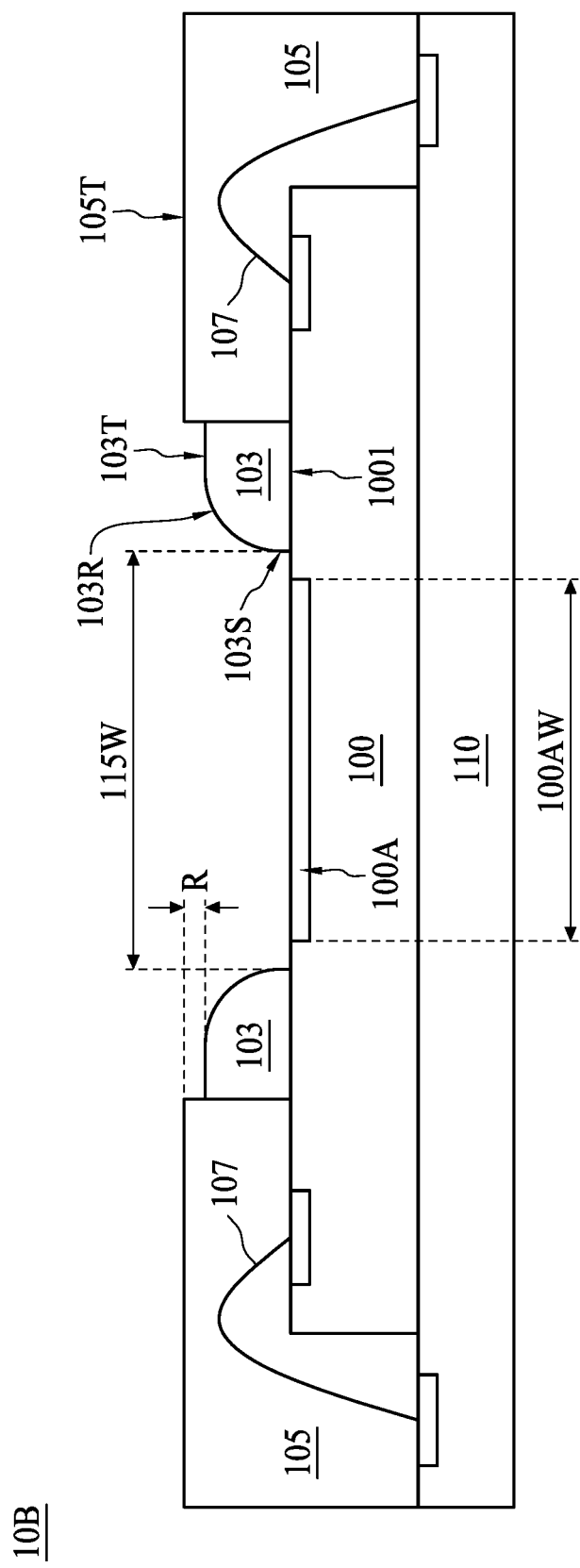
FIG. 1B illustrates a cross-sectional view of a semiconductor package structure, according to some embodiments of the present disclosure.

Referring to FIG. 1B, FIG. 1B illustrates a cross-sectional view of a semiconductor package structure 10B, according to some embodiments of the present disclosure. The semiconductor package structure 10B is similar to the semiconductor package structure 10A except for the dam 103 having a rounded corner 103R connecting the top surface 103T and the sidewall 103S. The rounded corner 103R may be a result of certain etching condition that attacks protruding features more than uniform features. When the etching condition is adjusted to perform etch uniformly on each feature of the dam, the dam structure may show a substantial flat top surface as illustrated in FIG. 1A.

Figure 1C:
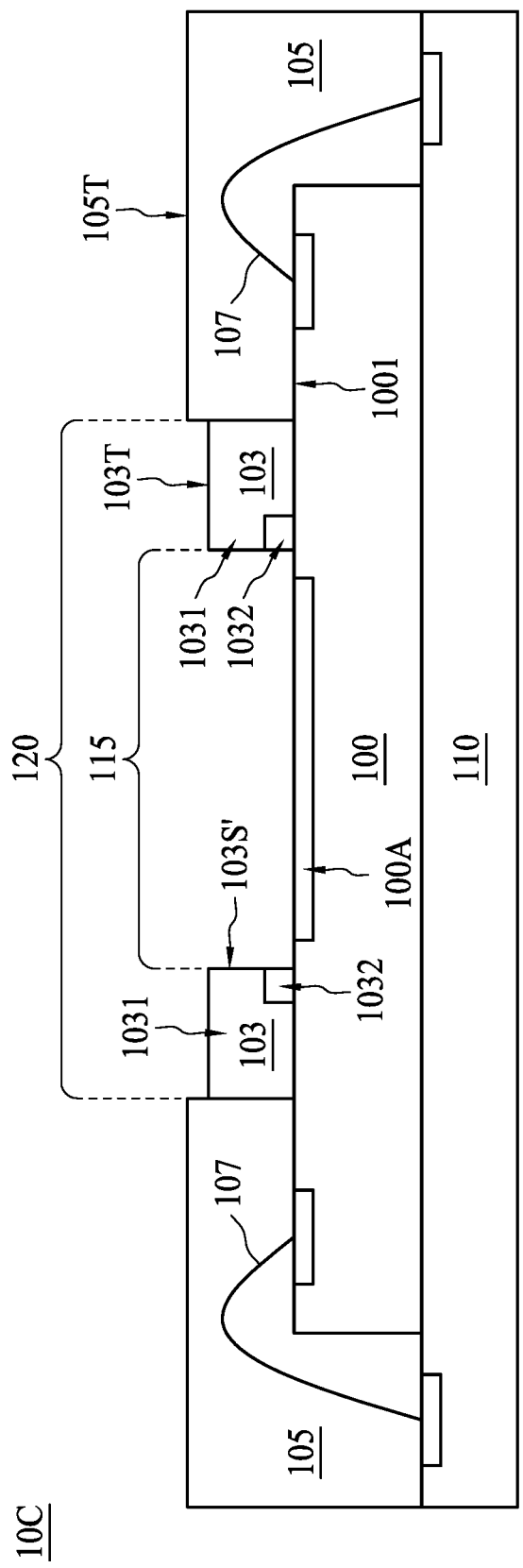
FIG. 1C illustrates a cross-sectional view of a semiconductor package structure, according to some embodiments of the present disclosure.

Referring to FIG. 1C, FIG. 1C illustrates a cross-sectional view of a semiconductor package structure 10C, according to some embodiments of the present disclosure. The semiconductor package structure 10C is similar to the semiconductor package structure 10A except for the dam 103 being composed of a first dielectric 1031 and a second dielectric 1032. In some embodiments, the first dielectric 1031 is composed of material having a viscosity greater than the second dielectric 1032. In some embodiments, the first dielectric 1031 is composed of similar material as the second dielectric 1032 with a different viscosity. In some embodiments, the first dielectric 1031 is composed of material different from the second dielectric 1032.

In some embodiments, the first dielectric 1031 may be composed of radiation or irradiation sensitive material which may perform photoinduced cross-linking as used in a negative photoresist. The intermediate layer comprises epoxidized bisphenol-A/formaldehyde novolac co-polymer (SU8). SU8, in the presence of an appropriate photo acid generator, favorably becomes a negative resist. It has a number of advantageous characteristics, including good film forming properties, good adhesion, simple processing, high optical transmission and, when cross-linked, excellent chemical and thermal stability. SU8 can also, favorably be deposited on a variety of substrate surfaces, and in general other thin films adhere well to it. In some embodiments, the second dielectric 1032 may be composed of polymeric material such as polyimide (PI) or polybenzoxazole (PBO).

As shown in FIG. 1C, the first dielectric 1031 covers the second dielectric 1032 in a way that the top surface of the second dielectric 1032 is in contact with the first dielectric 1031. In addition, a side surface of the second dielectric 1032 is in contact with the first dielectric 1031. In some embodiments, a side surface of the second dielectric 1032 is exposed to the open cavity and being substantially vertically aligned with a side surface of the first dielectric 1031. The second dielectric 1032 overlaps with a portion of the first dielectric 1031 on a side closer to the exposed region 115 or active region 100A.

Figure 1D:
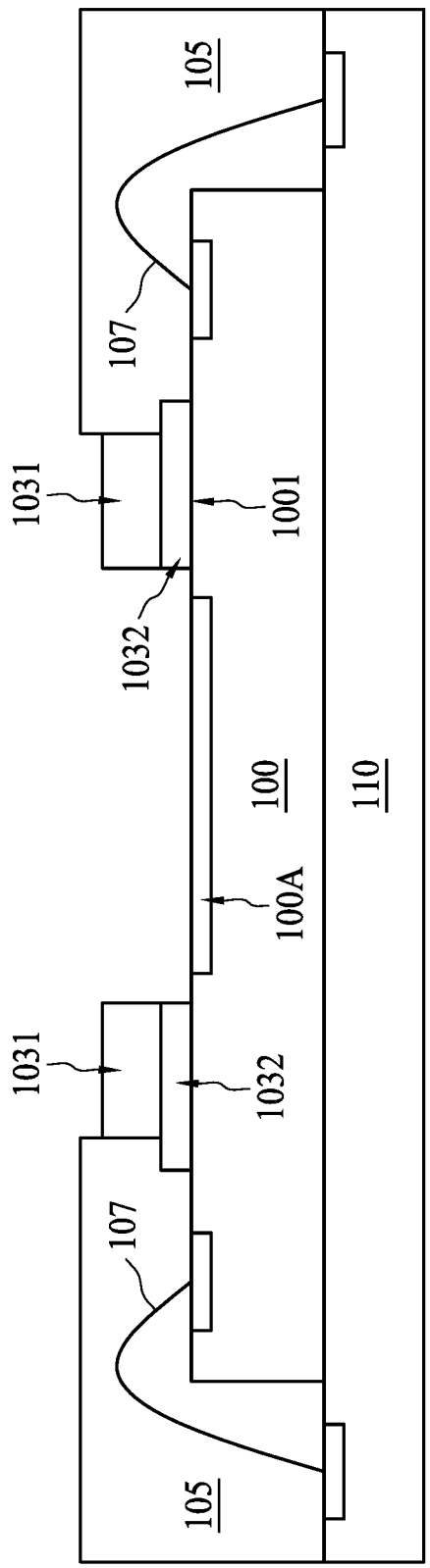
FIG. 1D illustrates a cross-sectional view of a semiconductor package structure, according to some embodiments of the present disclosure.

FIG. 1D illustrates a cross-sectional view of a semiconductor package structure 10D, according to some embodiments of the present disclosure. The semiconductor package structure 10D is similar to the semiconductor package structure 10C except for that the second dielectric 1032 overlaps with an entirety of the first dielectric 1031. Alternatively stated, a width of the second dielectric 1032 may be equal to or greater than a width of the first dielectric 1031. As depicted in FIG. 1D, the first dielectric 1031 covers the second dielectric 1032 in a way that the top surface of the second dielectric 1032 is in contact with the first dielectric 1031. In addition, a side surface of the second dielectric 1032 is in contact with the encapsulant 105. In some embodiments, a side surface of the second dielectric 1032 is exposed to the open cavity and being substantially vertically aligned with a side surface of the first dielectric 1031.

Although not illustrated in FIG. 1D, in some embodiments, a side surface of the second dielectric 1032 facing the encapsulant 105 may be substantially vertically aligned with a side surface of the first dielectric 1031.

Figure 1E:
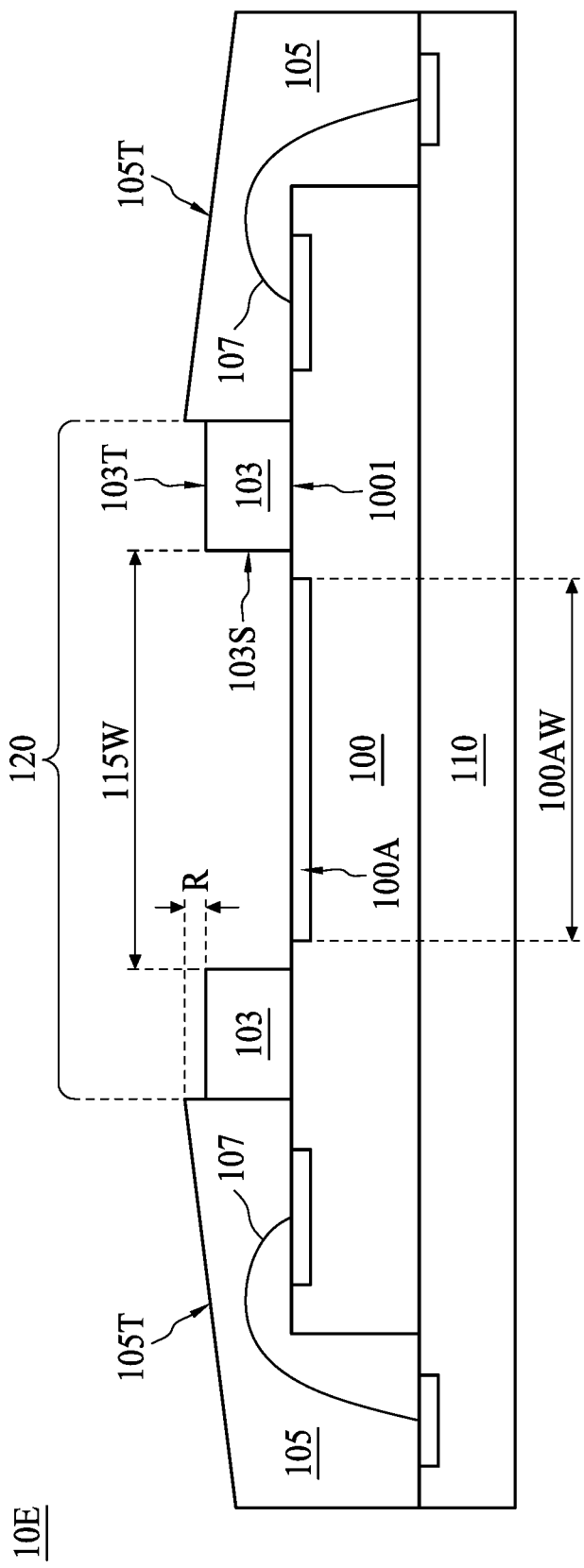
FIG. 1E illustrates a cross-sectional view of a semiconductor package structure, according to some embodiments of the present disclosure.

Referring to FIG. 1E, FIG. 1E illustrates a cross-sectional view of a semiconductor package structure 10E, according to some embodiments of the present disclosure. The semiconductor package structure 10E is similar to the semiconductor package structure 10A except for that the top surface 105T of the encapsulant 105 is an inclined surface. The top surface 103T of the dam 103 is retracted from the top surface 105T of the encapsulant 105 in a sense that a portion of the top surface 105T of the encapsulant 105 is higher than the top surface 103T of the dam 103. For example, the portion of the encapsulant 105 facing the open cavity 120 is higher than the top surface 103T of the dam 103, and the top surface 103T is retracted from the portion of the encapsulant 105 facing the open cavity 120. The portion of the encapsulant 105 facing away from the open cavity 120 may or may not be higher than the top surface 103T of the dam 103.

Figure 2:
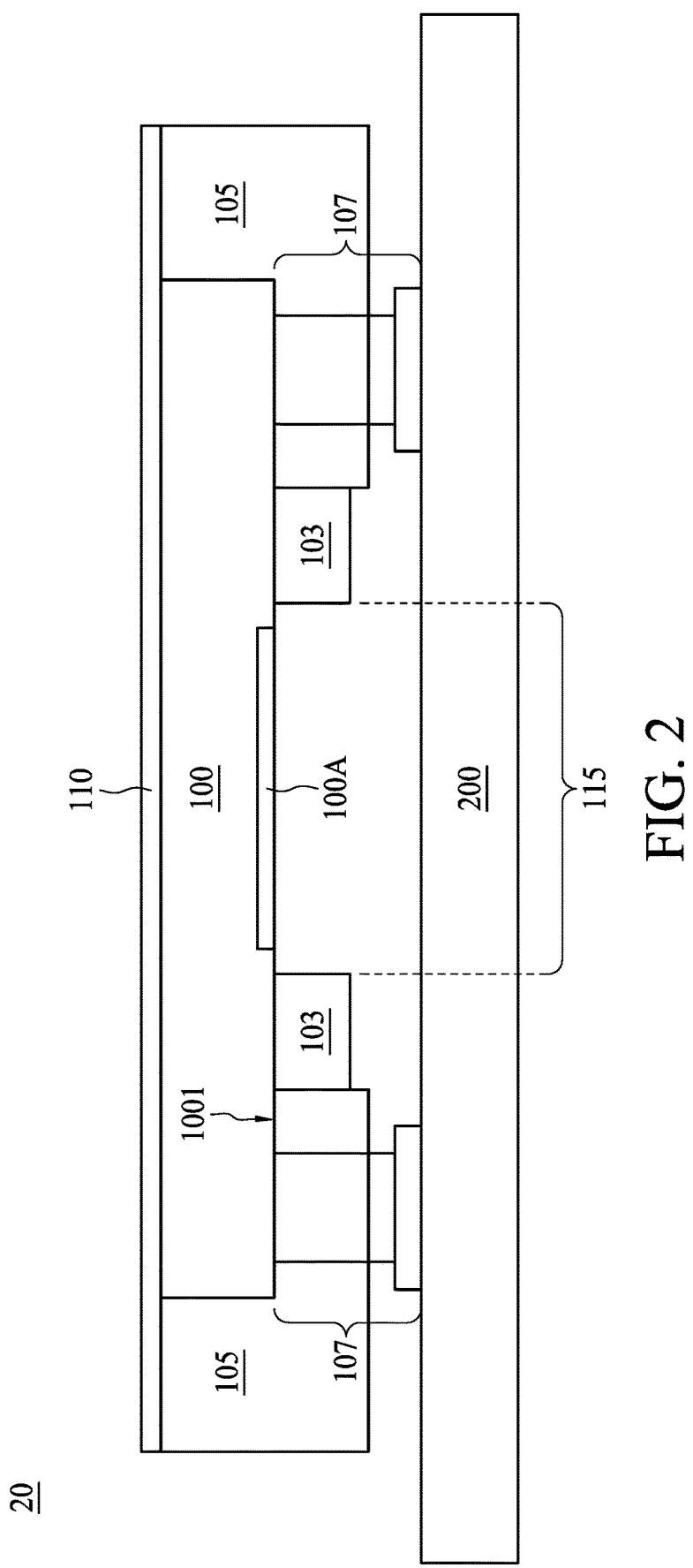
FIG. 2 illustrates a cross-sectional view of a semiconductor package structure, according to some embodiments of the present disclosure.

Referring to FIG. 2, FIG. 2 illustrates a cross-sectional view of a semiconductor package structure 20, according to some embodiments of the present disclosure. The semiconductor package structure 20 is similar to the semiconductor package structure 10A except for that the conductive terminal 107 may be in a form of conductive through via in the encapsulant 105. The conductive terminal 107 electrically coupling the exposed region 115 or the active region 100A of the electronic device 100 to a carrier 20 through, for example and not limiting, a conductive pad on the first surface 1001, a conductive through via 107 in the encapsulant 105, a conductive pad on a surface of the carrier 200, and a eutectic bonding between the conductive through via and the conductive pad on the surface of a carrier 200. In some embodiments, the conductive through via is covalent bonded to the conductive pad on the surface of a carrier 200. In some embodiments, the electronic device 100 having an open cavity structure is flip chip bonded to the carrier 200 through the conductive terminal 107.

Figure 3:
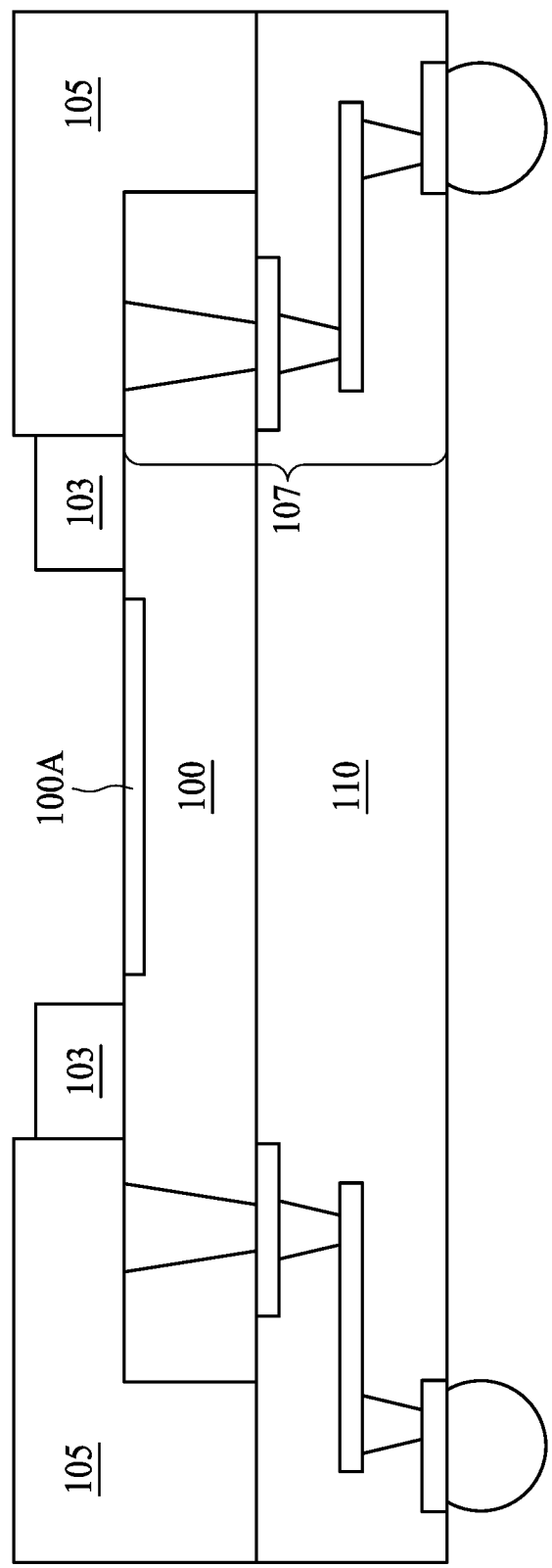
FIG. 3 illustrates a cross-sectional view of a semiconductor package structure, according to some embodiments of the present disclosure.

FIG. 3 illustrates a cross-sectional view of a semiconductor package structure 30, according to some embodiments of the present disclosure. The semiconductor package structure 30 is similar to the semiconductor package structure 10A except for that the conductive terminal 107 may be in a form of conductive through via in the electronic device 100. The conductive terminal 107 electrically coupling the exposed region 115 or the active region 100A of the electronic device 100 to an external component not illustrated in FIG. 3 through, for example and not limiting, a through silicon via in the electronic device 100, conductive traces in the carrier 110 or substrate, and a solder bump coupled to the conductive traces. In some embodiments, the electronic device 100 is having an open cavity structure and a fan out package structure through the conductive terminal 107.

FIG. 4A to FIG. 4C illustrate top views of a semiconductor package structure, according to some embodiments of the present disclosure. Referring to FIG. 1A and FIG. 4A, the exposed region 115 may include a width 115W, and the width 115W can be measured as a distance between inner sidewall surfaces of the dam 13 facing the exposed region 115. In FIG. 4A, the dam 13 possesses a circular shape from a top view perspective, and the exposed region 115 may also possess a circular shape from the top view perspective. In FIG. 4B, the dam 13 possesses a tetragonal shape from a top view perspective, and the exposed region 115 may also possess a tetragonal shape from the top view perspective. In FIG. 4C, the dam 13 possesses an oval shape from a top view perspective, and the exposed region 115 may also possess an oval shape from the top view perspective. The active region 100A in the exposed region 115 may possess a circular shape, as shown in FIG. 4A, a tetragonal shape, as shown in FIG. 4B, and an oval shape, as shown in FIG. 4C. The active region may include a width 100AW. Since the dam 103 is not projecting over the exposed region 115, or the active region 100A of the exposed region 115, the width 115W is greater than the width 100AW. The dam 13 is surrounded by the encapsulant 105 from a top view perspective.

Figure 5E:
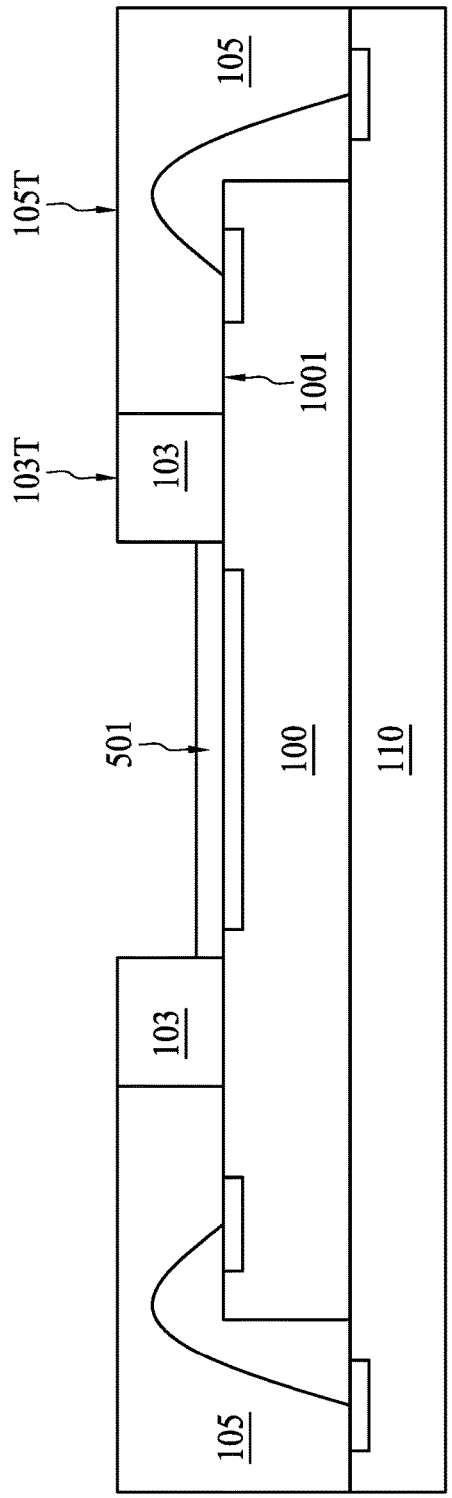

FIG. 5A to FIG. 5F illustrates cross sections of a semiconductor package structure during various manufacturing operations, according to some embodiments of the present disclosure. In FIG. 5A, a wafer having a plurality of device regions is provided. Each of the device regions possess an active region 100A, including, but not limited to, a movable part, a sensing region, or a membrane structure. For clarity, FIG. 5A selectively shows one device region on the wafer. The active region 100A is disposed adjacent to the first surface 1001 of the wafer. Several conductive pads 107A are patterned over the first surface 1001 of the wafer. In FIG. 5B, a passivation layer 501 is patterned over the first surface 1001 through, for example, a lithography operation. The passivation layer 501 is patterned to have a width 501W greater than a width 100AW of the active region from a cross sectional perspective. From a top view perspective, the patterned region of the passivation layer 501 fully covers and exceeding the boundary of the active region 100A. However, in some embodiments, the passivation layer 501 is patterned to have a width 501W substantially equal to a width 100AW of the active region from a cross sectional perspective.

In FIG. 5C, a dam 103 is patterned on the first surface 1001 adjacent to the passivation layer 501. In some embodiments, the dam 103 is patterned to surround and not overlapping with the passivation layer 501 through, for example, a lithography operation. Note the viscosity of the passivation 501 may be lower than the viscosity of the dam 103 so as to facilitate each of the patterning operations. The wafer is then separated along boundaries of each device region and individually placed over a carrier 110, a lead frame, or a strip substrate, as shown in FIG. 5D. In FIG. 5D, conductive terminal 107 is formed by a wire bonding operation, electrically coupling the active region of the electronic device 100 to the carrier 110.

In FIG. 5E, the electronic device 100, the conductive terminal 107, and the dam 103 are encapsulated by an encapsulant 105 through, for example, an open molding operation. A part of the mold tool is abutted to a top surface of the dam 103 such that during the molding operation, molding compound may not enter into the space surrounded by the dam 103. At the complete of the molding operation, the top surface 103T of the dam 103 is substantially coplanar with the top surface 105T of the encapsulant 105. Alternatively, the top surface 103T of the dam 103 may be slightly lower than the top surface 105T of the encapsulant 105 due to various molding conditions. An open cavity is formed in FIG. 5E.

Figure 5F:
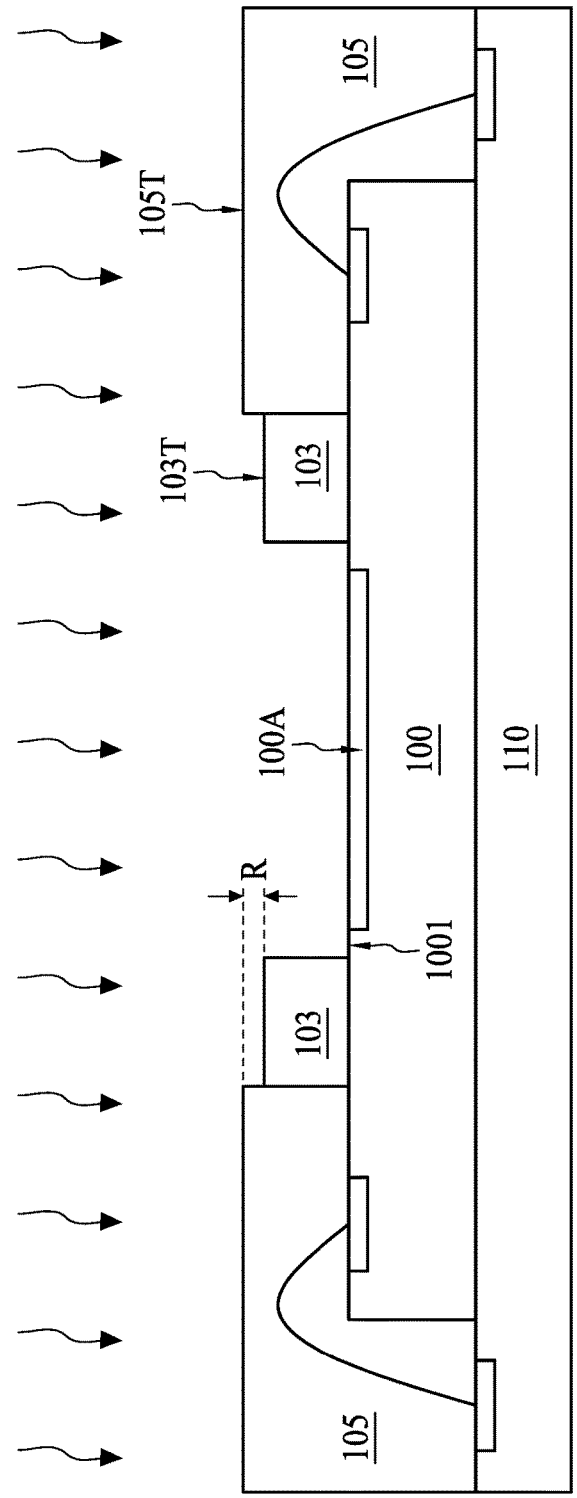

In FIG. 5F, the passivation layer 501 is removed to an extent that the first surface 1001 of the electronic device 100 is exposed. In some embodiments, the exposed portion of the first surface 1001 is the exposed region referred herein. The exposed portion includes an active region 100A of the electronic device 100. In some embodiments, the passivation layer 501 is removed by a directional etch operation, for example and not limited to, a reactive ion etch (ME) operation. The physical component of the ME removes the passivation layer 501 and the dam 103 from their respective top surfaces, and the chemical component of the RIE selectively removes the passivation layer 501 and the dam 103 without substantially removing the encapsulant 105. A step height R is formed between the top surface 105T and the top surface 103T after the directional etch. In some embodiments, the step height R may be substantially identical to a thickness of the passivation layer 501 originally patterned on the first surface 1001. In some embodiments, the step height R may be different from a thickness of the passivation layer 501 originally patterned on the first surface 1001. When the semiconductor package structure specifies a lower dam 103 to enhance the performance of the electronic device 100, for example, increase the sensitivity of a pressure sensor, a thickness of the passivation layer 501 originally formed on the first surface 1001 may be adjusted accordingly, and vice versa.

Figure 6A:
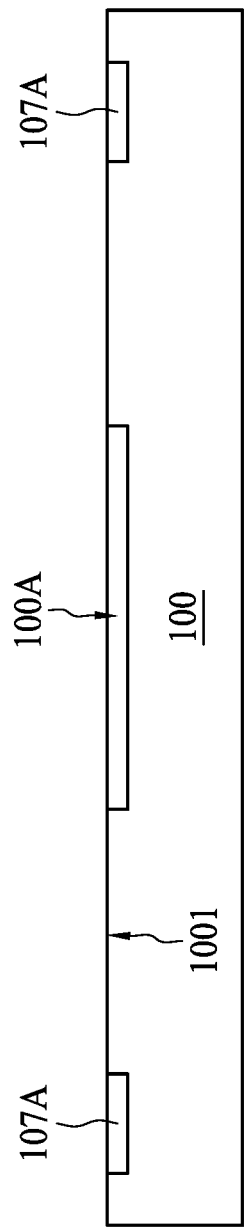
Figure 6B:
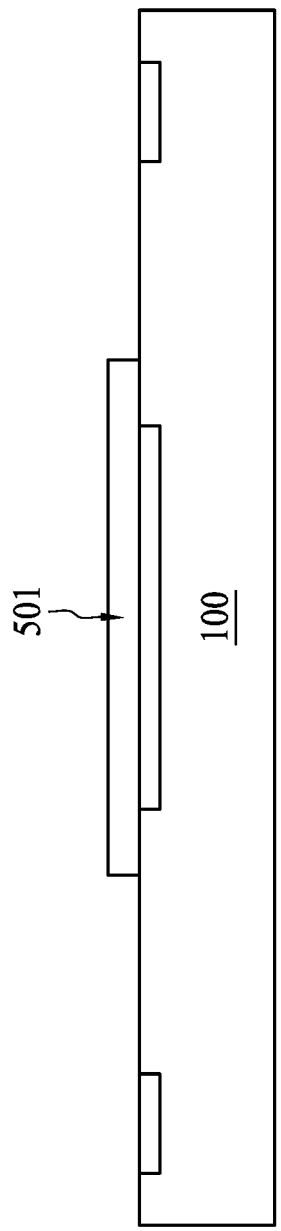
Figure 6E:
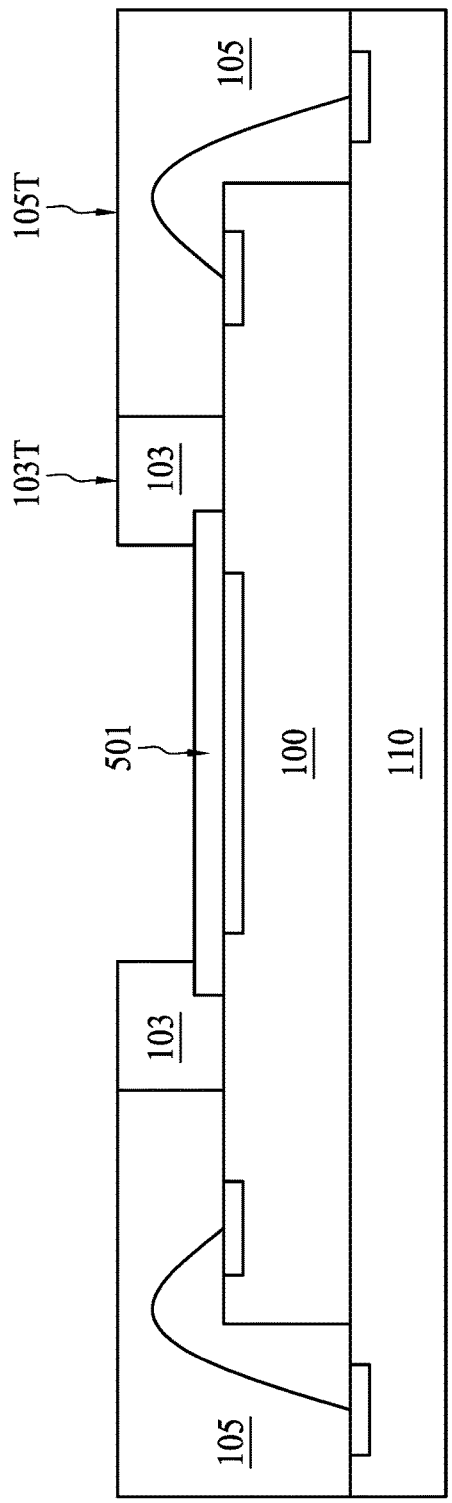
Figure 6F:
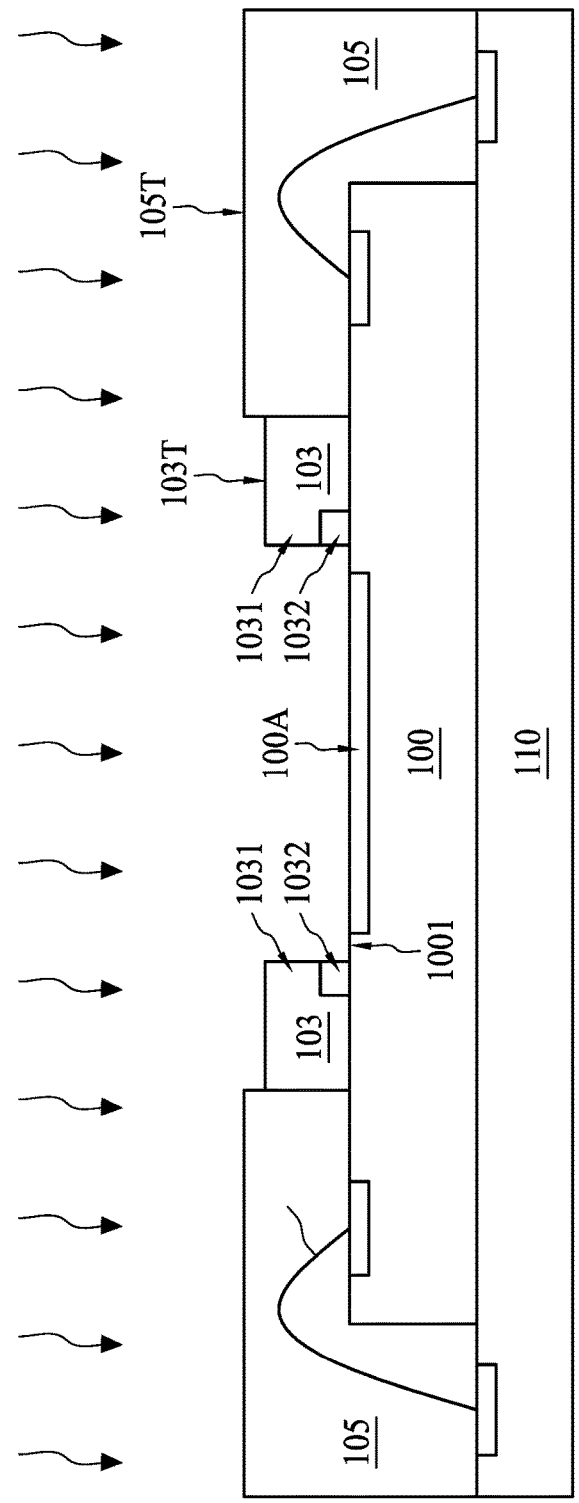

FIG. 6A to FIG. 6F illustrates cross sections of a semiconductor package structure during various manufacturing operations, according to some embodiments of the present disclosure. FIG. 6A to FIG. 6F are similar to FIG. 5A to FIG. 5F except for that in FIG. 6C, the dam 103 is patterned to surround and partially overlap with the passivation layer 501 through, for example, a lithography operation. In other words, a portion of the dam 103 is disposed on the first surface 1001 and another portion of the dam 103 is disposed on the passivation layer 501. The top surface of the dam 103 as patterned can be a substantially flat surface. In FIG. 6F, the passivation layer 501 is removed to an extent that the first surface 1001 of the electronic device 100 is exposed. In some embodiments, the passivation layer 501 is removed by a directional etch operation, for example and not limited to, a reactive ion etch (ME) operation. The physical component of the ME removes the passivation layer 501 and the dam 103 from their respective top surfaces, and the chemical component of the ME selectively removes the passivation layer 501 and the dam 103 without substantially removing the encapsulant 105. Due to the directional etch operation, the portion of the passivation layer 501 covered by the dam 103 is not removed during the ME operation, and a side surface of the passivation layer 501 facing the exposed region 115 is substantially vertically aligned with a side surface of the dam 103. The opposite side surface of the passivation layer 501 facing the encapsulant 105 terminates in the dam 103.

Figure 7A:
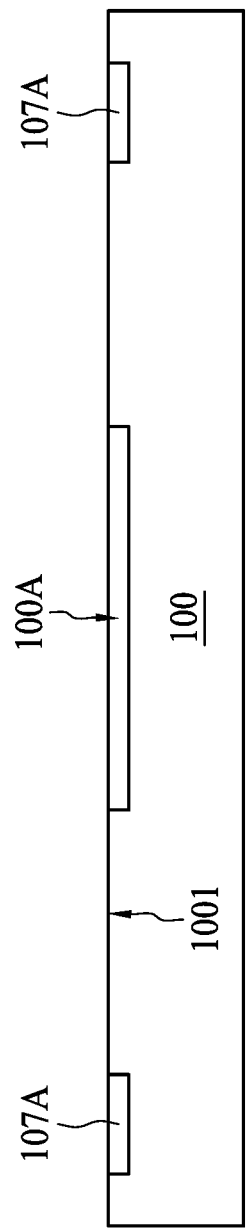
Figure 7B:
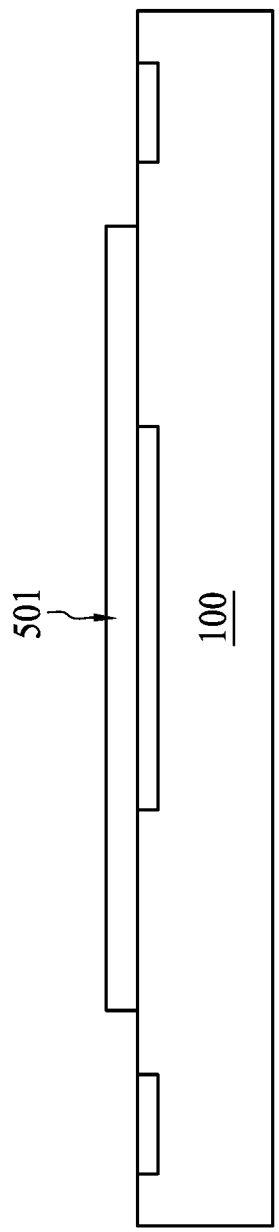

FIG. 7A to FIG. 7F illustrates cross sections of a semiconductor package structure during various manufacturing operations, according to some embodiments of the present disclosure. FIG. 7A to FIG. 7F are similar to FIG. 5A to FIG. 5F except for that in FIG. 7C, the dam 103 is patterned to surround and entirely overlap with the passivation layer 501 through, for example, a lithography operation. In other words, the entire dam 103 is disposed on the passivation layer 501. In FIG. 7F, the passivation layer 501 is removed to an extent that the first surface 1001 of the electronic device 100 is exposed. In some embodiments, the passivation layer 501 is removed by a directional etch operation, for example and not limited to, a reactive ion etch (ME) operation. The physical component of the ME removes the passivation layer 501 and the dam 103 from their respective top surfaces, and the chemical component of the RIE selectively removes the passivation layer 501 and the dam 103 without substantially removing the encapsulant 105. Due to the directional etch operation, the portion of the passivation layer 501 covered by the dam 103 is not removed during the RIE operation, and a side surface of the passivation layer 501 facing the exposed region 115 is substantially vertically aligned with a side surface of the dam 103. The opposite side surface of the passivation layer 501 facing the encapsulant 105 may extend under the encapsulant 105 or may substantially vertically align with an opposite side surface of the dam 103 facing the encapsulant 105.

In some embodiments, the portion of the passivation layer 501 covered by the dam 103 can be the second dielectric 1032 referred herein, whereas the dam covering the second dielectric 1032 can be the first dielectric 1031 referred herein. Allowing the dam 103 to partially overlap with the passivation layer 501 or completely overlap with the passivation layer 501 can widen the lithography processing window, especially the alignment operations between the dam 103 and the passivation layer 501.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package structure, comprising:
   an electronic device having an exposed region adjacent to a first surface of the electronic device;
   a dam around the exposed region of the electronic device and disposed on the first surface; and
   a dielectric layer around the exposed region of the electronic device and disposed on the first surface,
   wherein the dam covers the dielectric layer from a top view perspective over the first surface and normal to the exposed region, wherein the dam and the dielectric layer are composed of different materials, and wherein an inner lateral surface of the dam is substantially aligned with an inner lateral surface of the dielectric layer,
   wherein a top surface of the dam is substantially parallel to a top surface of the dielectric layer, wherein an outer lateral surface of the dam is substantially parallel to an outer lateral surface of the dielectric layer, and wherein a bottom surface of the dam is substantially co-leveled to a bottom surface of the dielectric layer.

2. The semiconductor package structure of claim 1, wherein a distance between two opposite inner lateral surfaces of the dam is greater than a length of the exposed region.

3. The semiconductor package structure of claim 2, further comprising an encapsulant in contact with the dam.

4. The semiconductor package structure of claim 3, wherein a top surface of the encapsulant is higher than the top surface of the dam in elevation.

5. The semiconductor package structure of claim 4, wherein the top surface of the encapsulant is substantially parallel to the top surface of the dam.

6. The semiconductor package structure of claim 1, further comprising a conductive wire on a peripheral portion of the first surface of the electronic device, wherein the conductive wire connects the electronic device and a substrate.

7. The semiconductor package structure of claim 6, further comprising an encapsulant encapsulating the conductive wire.

8. The semiconductor package structure of claim 6, further comprising a conductive pad on the first surface connected to the conductive wire, wherein dam is more adjacent to the exposed region than to the conductive pad.

9. The semiconductor package structure of claim 8, wherein the dam is more adjacent to the exposed region than to the conductive wire.

10. The semiconductor structure of claim 1, further comprising:
    an encapsulant encapsulating the first surface of the electronic device and exposing the exposed region of the electronic device,
    wherein the dam is configured to enhance performance of the electronic device.

11. The semiconductor package structure of claim 10, wherein the dam is configured to increase sensitivity of a pressure sensor.

12. The semiconductor package structure of claim 11, wherein a top surface of the dam is lower than a top surface of the encapsulant in elevation.

13. The semiconductor package structure of claim 12, wherein the dielectric layer is below a portion of the dam, wherein a step height between the top surface of the encapsulant and the top surface of the dam is predetermined by a thickness of the dielectric layer.

14. The semiconductor package structure of claim 13, wherein the step height is substantially equal to the thickness of the dielectric layer.

15. The semiconductor package structure of claim 13, wherein an inner lateral surface of the encapsulant is substantially parallel to an inner lateral surface of the dam.

16. The semiconductor package structure of claim 15, wherein the top surface of the encapsulant is substantially perpendicular to a lateral surface of the encapsulant.

* * * * *